United States Patent [19]

Dini

[11] 4,197,503
[45] Apr. 8, 1980

[54] CIRCUIT ARRANGEMENT FOR GENERATING TUNING VOLTAGE

[75] Inventor: Roberto Dini, Turin, Italy
[73] Assignee: Indesit Industria Elettrodomestici Italiana S.p.A., Italy
[21] Appl. No.: 883,236
[22] Filed: Mar. 3, 1978
[30] Foreign Application Priority Data Mar. 3, 1977 [IT] Italy .................. 67461 A/77

[51] Int. Cl.² ............................................ H04B 1/26
[52] U.S. Cl. .................................. 455/195; 455/180; 455/179; 455/150; 334/15
[58] Field of Search ............... 325/452, 453, 458, 459, 325/464, 468, 470; 334/15; 331/179, 177 V

[56] References Cited

U.S. PATENT DOCUMENTS

| | | | |
|---|---|---|---|
| 3,449,749 | 6/1969 | McEvoy | 343/113 |
| 3,646,450 | 2/1972 | Ma | 325/458 |
| 3,839,681 | 10/1974 | Mogi | 325/464 |
| 3,893,049 | 7/1975 | Bray | 325/459 |
| 3,961,267 | 6/1976 | Weissmueller, Jr. | 325/470 |
| 3,968,444 | 7/1976 | Tenny | 325/470 |

FOREIGN PATENT DOCUMENTS 1801290 10/1969 Fed. Rep. of Germany .

OTHER PUBLICATIONS

IEEE Trans—on Broadcast & T.V. Receivers, vol. BTR-20, No. 3, Aug. 1974, "Integrated Circuit System for Channel Selection of Varactor—Tuned T.V. Receivers", pp. 235-246—R. W. England et al.

*Primary Examiner*—Marc E. Bookbinder
*Attorney, Agent, or Firm*—Lerner, David, Littenberg & Samuel

[57] ABSTRACT

The invention relates to broadcast receivers having a voltage controlled tuning device and in particular to a circuit arrangement for applying a voltage to the tuning device. The circuit arrangement is so designed as to be capable of producing tuning voltages to tune the receiver into the desired channels but at the same time being inhibited from producing voltages which tune the receiver into undesired channels such as police channels.

12 Claims, 3 Drawing Figures

CIRCUIT ARRANGEMENT FOR GENERATING TUNING VOLTAGE

BACKGROUND OF THE INVENTION

The present invention relates to a broadcast receiver and to a circuit arrangement for applying a tuning voltage to a tuning device of a broadcast receiver.

It is known in the field of radio and television receivers to use devices which vary their capacitance according to an applied control voltage, as in the case of varactor or "varicap" diodes, for example, to enable tuning to be effected by varying the control voltage. In practice, the variations in the capacitance of the varactor diodes alter the frequency of the local oscillator of the receiver which changes the received radio frequency signal down to the intermediate frequency of the receiver.

In the case of television signals, the receiver must be capable of receiving a wide range of transmission channels on two different frequency bands, namely VHF and UHF.

However, these two bands are not adjacent. In fact, the first covers a frequency range of 47–300 MHz and the second 470–900 MHz.

As it is not simple, with a single local oscillator using varactor diodes, to obtain a tuning range wide enough to cover both the VHF and UHF bands, the normal practice is to use two independent oscillators. In this case, there is only one arrangement for generating the tuning voltage which is connected selectively to one or the other of the oscillators, which is activated depending on whether the channel to be received is in the VHF or UHF band.

Systems are also known in which, by means of a double frequency conversion performed inside the tuner, a single oscillator can be used, piloted by a single tuning voltage generating arrangement, which can cover the whole frequency range required for tuning channels both on the VHF and UHF bands. However, as these channel bands are not adjacent when switching from a VHF to a UHF channel, other types of broadcasting channels will be received, such as those reserved for police broadcasts, to which it is illegal to listen. Provision must therefore be made to prevent the receiver from tuning into these channels.

Apart from the legal aspect, there are also other disadvantages. One of these is disturbance on the screen in the case of a television receiver capable of receiving radio broadcasts. As coding of these is completely different from television broadcastings, radio broadcasts received on a television receiver result in a series of moving black lines which may be interpreted by the user as a breakdown of the receiver.

BRIEF DESCRIPTION OF THE INVENTION

The present invention seeks to avoid the above disadvantages and in particular to provide a broadcast receiver which can be prevented from receiving any given channels within its tuning range.

According to one aspect of the present invention, there is provided a broadcast receiver comprising a voltage controlled tuning device and a circuit arrangement for applying a tuning voltage to the tuning device, wherein when the tuning voltage is varied continuously from an upper to a lower limit the frequency of the tuning device varies continuously in a tuning range which includes all channels from a first lower frequency channel up to a second higher frequency channel including an intermediate range of undesired channels, and wherein to prevent the reception of undesired channels the said circuit arrangement is constructed in such a manner as to be capable of producing all tuning voltages between said upper and lower limits with the exception of tuning voltages corresponding to frequencies in said intermediate range.

According to a second aspect of the present invention, there is provided a circuit arrangement for applying a tuning voltage to a tuning device of a broadcast receiver, which comprises a device for producing a variable voltage, and a comparator for detecting when the voltage at the output of the said device attains a predetermined value and being operative to increment the said voltage up to a second predetermined value whereby the circuit arrangement is precluded from producing voltages lying between the said first and second predetermined values.

BRIEF DESCRIPTION OF THE FIGURES

The invention will now be described further, by way of example, with reference to the accompanying drawings, in which.

DETAILED DESCRIPTION OF THE INVENTION

Figure 1:
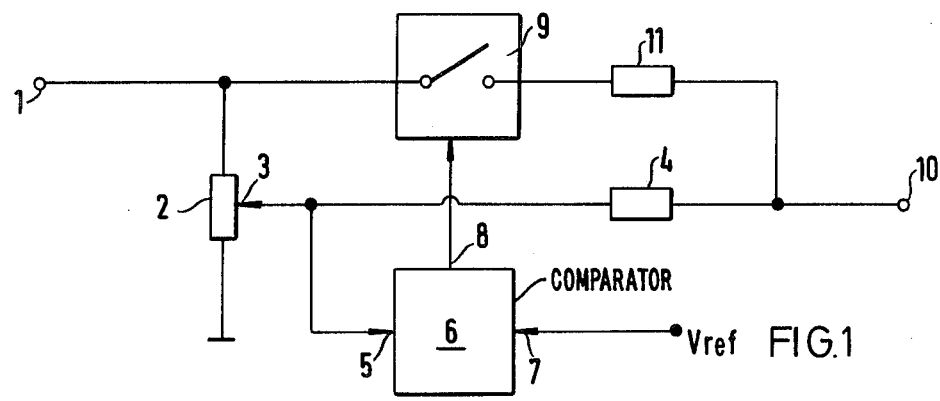
FIG. 1 shows a partial block diagram of one possible application of the arrangement for generating a tuning voltage as described in the present invention.

FIG. 1 shows a block diagram of an arrangement for generating a tuning voltage for controlling a varactor diode in a voltage controlled oscillator of a television receiver tuner.

The arrangement has an input terminal 1 to which a stabilized d.c. voltage is applied, for example, using a ZTK33 type integrated circuit. This d.c. voltage is supplied to the terminals of a potentiometer 2 which is activated manually by the user when selecting the required television channel. One terminal of potentiometer 2 is grounded while its slider 3 is connected to one end of a resistor 4 and to a first input 5 of a voltage comparator circuit 6. Comparator circuit 6 also has a second input 7 to which a reference voltage (V ref.) is applied and an output 8 which operates an electronic switch circuit 9. The switch circuit 9 is connected, at one end, to terminal 1 and, at the other, to an output terminal 10 by means of a second resistor 11. The output terminal 10 is also connected to the other end of resistor 4.

The circuit shown in FIG. 1 operates as follows:

A fraction of the stabilized voltage developed across the potentiometer 2 is picked up by the slider 3, and applied to the output terminal 10 which supplies it to the varactor diode in the oscillator circuit of the tuner (not shown). There is a negligible voltage drop across resistor 4 as the varactor diode draws practically no current.

The electronic switch 9 is normally open. However, when the voltage at the slider 3 exceeds a given value, comparator 6 produces a control signal to close the switch circuit 9. Now current can flow through both resistors 11 and 4 developing a voltage drop which increases the voltage obtaining at the output terminal 10. Therefore, if the threshold at which the switch 9 closes has been selected so as to correspond with the maximum tuning voltage required for tuning into the highest frequency channel in the VHF band, and the voltage increase is such that the oscillator of the tuner is tuned into the lowest frequency channel in the UHF band, all the channels between these two bands will be cut out.

Figure 2:
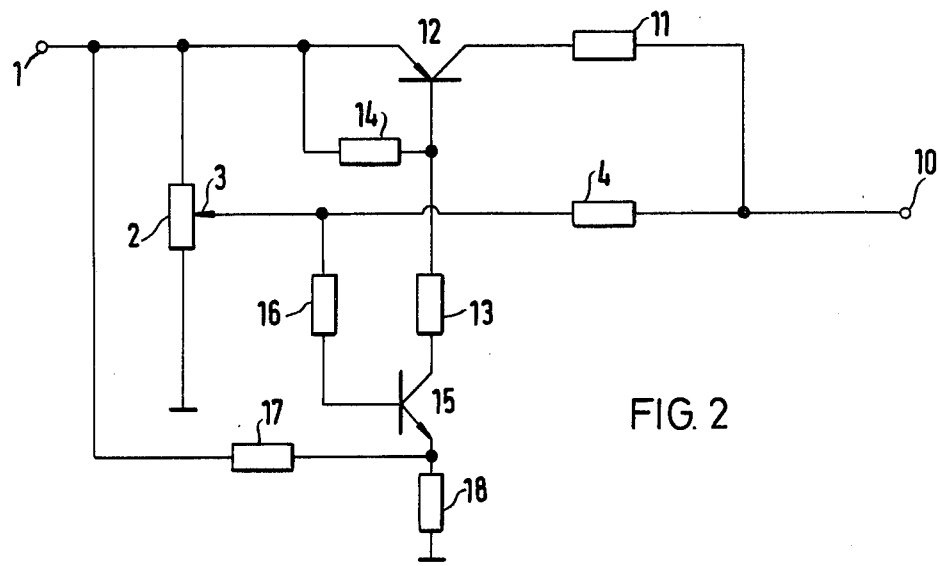
FIG. 2 shows a possible circuit arrangement to perform the functions shown schematically in FIG. 1.

FIG. 2 shows a more detailed circuit diagram of the arrangement shown in FIG. 1. In FIGS. 1 and 2, like parts have been allocated the same reference numerals. The switch 9 of FIG. 1 is constituted in FIG. 2 by a PNP transistor 12 of which the emitter is connected to input terminal 1, the collector to resistor 11 and the base of transistor 12 to its emitter by way of a resistor 14. Comparator circuit 6 of FIG. 1 comprises an NPN transistor 15 of which the base constitutes one comparator input and is connected to the slider 3 by way of a resistor 16 and the emitter constitutes the second comparator input connected to a reference voltage (V ref.) obtaining at the junction of two resistors 17 and 18 which form a voltage divider connected between terminal 1 and ground. The collector of transistor 15 is connected by way of a resistor 13 to the base of the transistor 12.

The circuit in FIG. 2 operates as follows:

As long as the voltage at slider 3 is below the preset voltage at the emitter of transistor 15 (5V in this case), transistor 15 is blocked and, consequently, transistor 12 is also switched off. As practically no d.c. current is absorbed by the varactor diode connected to terminal 10, the voltage drop across resistor 4 is negligible, so that the voltage at terminal 10 is the same voltage present on the slider 3 of the potentiometer 2. When the voltage on slider 3 exceeds the threshold determined by the voltage present on the emitter of transistor 15, plus the $V_{BE}$ of the transistor itself, transistor 15 conducts and switches on transistor 12 to saturation. In this way, current flows in the circuit formed by resistors 11 and 4, and the section of the potentiometer lying between the slider 3 and ground, producing a voltage drop, particularly on resistor 4, which is added to the voltage present on slider 3. The output voltage therefore rises (to 9V in this case) so as to cause the tuning voltage to jump over the frequency range corresponding to the channels lying between the VHF and UHF bands. The existence of a positive feedback between the two transistors means the switch from one brand to the next is made very quickly. As soon as transistor 15 and transistor 12 start conducting, the voltage on the base of transistor 15 increases, as a result of the voltage drop on resistor 4. Therefore the transistor 15 and also transistor 12 switch quickly as a result of the positive feedback from the off condition to the saturated "on" condition. The following is a list, provided by way of a non-limiting example, of the values of the parts used in the described circuit which has been tried and found to operate satisfactorily.

| TABLE OF VALUES | |
| --- | --- |
| Potentiometer 2 | 100 Kohm |
| Resistor 4 | 100 Kohm |
| Resistor 11 | 680 Kohm |
| Transistor 12 | BC 251 B |
| Resistor 13 | 220 Kohm |
| Resistor 14 | 56 Kohm |
| Transistor 15 | BC 147 C |
| Resistor 16 | 100 Kohm |
| Resistor 17 | 15 Kohm |
| Resistor 18 | 2.7 Kohm |

Figure 3:
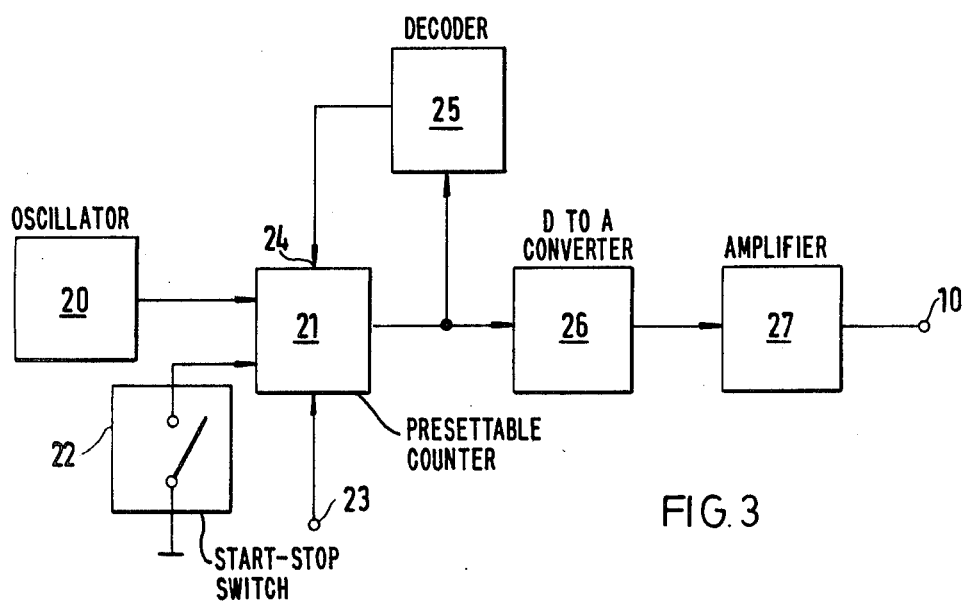
FIG. 3 shows one of the possible variations to the arrangement for generating tuning voltage as described in the present invention.

FIG. 3 shows a variant of the arrangement shown in FIGS. 1 and 2. The arrangement shown in FIGS. 1 and 2 for generating tuning voltage is designed to operate on a manual channel selection system using a potentiometer.

The arrangement shown in FIG. 3 is designed for connection to tuning devices with automatic channel selection using digital techniques. A number of such devices are known and termed "tuning memories".

In FIG. 3 an oscillator 20 applies a clock signal to a first input terminal of a presettable counter 21. The counter 21 has a second activating input terminal which receives a "start-stop" (count enabling or disabling) signal from a "start-stop" circuit 22. For automatic channel selection, the user operates a button which forms part of "start-stop" circuit 22. The presettable counter 21 also has a preset terminal 23 to which binary data is sent concerning the value that the counter must supply at its output when it receives a "set" signal at a "set" terminal 24. The output of counter 21 is connected, on the one hand, to a decoding logic network 25 connected to the "set" terminal 24 and, on the other hand, to a digital-analogue converter 26. The digital-analogue converter is connected to an amplifier 27, the output terminal 10 of which is connected to a varactor diode (not shown) in the tuner.

The circuit of FIG. 3 operates as follows:

To operate the automatic channel selection system, the user presses the push-button of the circuit 22. This causes a pulse to be given out which enables the counter 21. The counter 21 starts supplying values at its output which are transformed by the digital-analogue converter 26 into d.c. voltages. These d.c. voltages are supplied to the varactor diode in the tuner by way of the amplifier 27. When the output of the counter is such that it has been possible to tune in to a television channel and the user wishes to memorize the tuning voltage of the channel in question, the start-stop circuit supplies a "stop" signal and the counter is stopped.

To prevent the varactor diode from receiving tuning voltages of unwanted channels, it is sufficient to prevent the counter from supplying values corresponding to these voltages at its output. This function is performed by the decoding network 25 which analyzes the values at the output of counter 21 and, if these fall within the range of values to be avoided, activates "set" terminal 24 which causes the output of the counter to switch to a higher value or, more precisely, to the value which has been present on the "preset" terminal 23.

The advantages of the present invention will be seen clearly from the description given, in particular, the possibility of providing a simple means of preventing the reception of unwanted channel bands without altering the tuner circuits which, given the high frequency at which they operate, are particularly critical.

To those skilled in the art, it will be clear that many variations can be made to the circuits described without, however, departing from the scope of the present invention as set forth in the appended claims. These include, for example, the use of one of the above arrangements for generating a tuning voltage on a radio instead of a television set, or the use of a number of similar circuits for cutting out several channel bands as opposed to a single band as described in the present invention. Another possible variation is to use a circuit which, instead of providing added voltage to that supplied by the potentiometer to prevent unwanted channels being received, connects a limiting circuit between the slider and output terminal which, by means of zener diodes, for example, prevents voltages within a given range being applied to the tuner, regardless of whether the user continues moving the slider on the potentiometer.

I claim:

1. A circuit arrangement for use in controlling a voltage controlled tuning device of a broadcast receiver, said circuit arrangement being adapted to apply a tuning voltage to the tuning device wherein, when the tuning voltage is varied continuously from a lower to an upper limit, the frequency of the tuning device varies continuously over a tuning range which includes all channels from a first lower frequency channel of a first wavelength up to a second higher frequency channel of a second higher wavelength and including an intermediate range of undesired channels whose wavelengths are located between said first lower and said second upper wavelength and in order to prevent reception of said undesired channels, said circuit arrangement including:

first means for producing all tuning voltages between said upper and lower limits including those tuning voltages corresponding to said undesired channels whose frequencies lie in said intermediate range;

analyzing circuit means responsive to said first means for generating a control signal when the tuning voltage developed by said first means reaches at least a predetermined value; and third circuit means responsive to said control signal for altering the tuning voltage appearing at the output of said first means by a predetermined amount to thereby abruptly skip the tuning voltages representing said undesired channels.

2. A circuit arrangement for applying a tuning voltage to a tuning device of a broadcast receiver, which comprises:

first means for producing a variable voltage wherein, when the tuning voltage is varied continuously from a lower to an upper limit, the frequency of the tuning device varies continuously over a tuning range which includes all channels from a first lower frequency channel of a first wavelength and a second higher frequency channel of a second wavelength and including an intermediate range of undesired channels whose wavelengths lie between said first and second wavelengths;

an analyzing circuit for detecting when the voltage at the output of said first means attains at least a predetermined value; and an alteration circuit responsive to said analyzing circuit for altering the output voltage developed by said first means by a predetermined amount so that the circuit arrangement is precluded from producing voltages representing said undesired channels.

3. A circuit arrangement claimed in claim 2 further comprising a stabilized voltage source; a reference voltage source; a potentiometer connected to said stabilized voltage source and including a wiper arm for developing a variable voltage of a value determined by the position of said wiper arm; and a voltage comparator for comparing the variable voltage developed by said potentiometer wiper arm with said reference voltage source to produce a control signal which is employed to control the operation of said alteration circuit.

4. A circuit arrangement claimed in claim 3, wherein said alteration circuit includes a switch responsive to said voltage comparator for coupling a portion of said stabilized voltage to the variable voltage appearing at said wiper arm.

5. The circuit arrangement claimed in claim 4, wherein said reference voltage means comprises a voltage divider coupled to said stabilized voltage source for developing said reference voltage.

6. The circuit arrangement of claim 3, wherein said voltage comparator comprises first transistor means having emitter, base and collector electrodes; said reference voltage source and said variable voltage each being connected to one of said emitter and base electrodes.

7. The circuit arrangement of claim 4, wherein said switch means comprises second transistor means having emitter, base and collector electrodes; the output of said voltage comparator being connected to the base electrode of said second transistor means.

8. The circuit arrangement of claim 2, wherein said first means further comprises a source of clock pulses; counter means coupled to said source of clock pulses; digital to analog converter means being coupled to the output of said counter means for developing an analog voltage representative of the count in said counter means; decoder means responsive to the count in said counter means and including means for altering the count in said counter means by a predetermined amount when the count in said counter means reaches a first predetermined value for abruptly resetting said counter means to a second predetermined count, thereby causing the output of the digital to analog converter to be abruptly altered.

9. The circuit arrangement of claim 8, wherein said counter means includes preset input means and means for applying a signal corresponding to said second predetermined count to said preset input means; said counter means being abruptly set to said second predetermined count responsive to the output signal developed by said decoder means.

10. The circuit arrangement of claim 7, wherein the collectors of said first and second transistors are respectively connected to the bases of said second and first transistors, the polarity of the output connections being adapted to provide positive feedback in order to improve the operating speed of the circuit arrangement.

11. The circuit arrangement of claim 7 further comprising first and second resistor means for respectively coupling the output terminal of said circuit arrangement to the collector of said second transistor means and to said wiper arm.

12. The circuit arrangement of claim 11 comprising third transistor means coupled to the common terminal between said wiper arm and said second transistor means and one input of said comparator.

* * * * *